United States Patent [19]

Maruyama et al.

[11] Patent Number: 5,009,944

[45] Date of Patent: Apr. 23, 1991

[54] LIGHTSAFE MASKING FILM

[75] Inventors: Hiroshi Maruyama, Misato; Naohiko Kiryu, Urawa; Etsuko Minezaki, Misato; Susumu Tagashira, Koshigaya; Hisashi Shimokawahara, Chiba, all of Japan

[73] Assignee: Somar Corporation, Japan

[21] Appl. No.: 381,181

[22] Filed: Jul. 18, 1989

[30] Foreign Application Priority Data

Jul. 20, 1988 [JP] Japan ................................ 63-182464
Jan. 31, 1989 [JP] Japan ...................................... 1-21911

[51] Int. Cl.$^5$ ............................ B32B 7/06; B32B 7/12
[52] U.S. Cl. ........................................ 428/40; 428/195; 428/401; 428/532
[58] Field of Search ................. 428/40, 195, 401, 532; 106/199

[56] References Cited

U.S. PATENT DOCUMENTS 3,051,670  8/1962  Grantham ............................ 524/32
4,681,784  7/1987  Ebara et al. ......................... 428/40

FOREIGN PATENT DOCUMENTS 0188292  7/1986  European Pat. Off. ............ 428/343

Primary Examiner—Alexander S. Thomas
Attorney, Agent, or Firm—Lorusso & Loud

[57] ABSTRACT

A lightsafe masking film is disclosed which comprises a substrate, a pressure sensitive adhesive layer formed on the substrate, and a lightsafe, peelable layer formed on the adhesive layer and including a dialkyl phthalate, nitrocellulose, a lightsafe colorant and, optionally, a filler and a nitrile rubber. The peelable layer further suitably contains a dialkyl ester of an aliphatic dicarboxylic acid.

18 Claims, No Drawings

LIGHTSAFE MASKING FILM

This invention relates to a lightsafe masking film to be used in the photomechanical reproduction process.

Heretofore, a lightsafe masking film having a peelable layer has been used in two ways. In one way, the membrane is peeled off and discarded. In the other way, the peeled membrane is used for resticking. The former method is common. With respect to lightsafe masking films for common use, there have been proposed several products which do not have a sticky surface. For example, Japanese Patent Publication No. 56011/1983 discloses a lightsafe masking film provided with a peelable layer composed of nitrile rubber, nitrocellulose and lightsafe colorant. However, in the case of this masking film, the membrane loses its adhesion properties once it has been peeled off, and it cannot be used again for resticking.

A lightsafe masking film is known which is usable for resticking. It is formed of a plastic film, an adhesive layer, a colored resin layer, and a peelable layer formed one on top of another, with a pressure sensitive adhesive layer interposed between the two layers mentioned last (Japanese Patent Publication No. 9922/1979). A lightsafe masking film of this type has a disadvantage that the film surface is sticky during work due to the pressure sensitive adhesive layer.

U.S. Pat. No. 4,681,784 owned by Somar Corporation discloses a lightsafe masking film having a peelable layer capable of being used for resticking. This masking film has a substrate of plastic film, a pressure sensitive adhesive layer formed on the substrate, and a lightsafe, peelable layer formed on the adhesive layer and containing (a) a nitrile rubber, (b) nitrocellulose, (c) tackiness improver, and (d) a lightsafe colorant. As the tackiness improver, there is suggested specifically the use of di(butoxyethoxyethyl) adipate, trioctyl trimellitate, an epoxidized fatty acid ester or a polycarboxylate ester. While the lightsafe layer of this masking film exhibits suitable resistance to breakage or damage when it is peeled off from the substrate, it has been found that the peeled layer is susceptible to dimensional changes so that it is not fully satisfactorily used for resticking.

SUMMARY OF THE INVENTION

The present invention has been made to solve the above problem and has as its object provision of an improved lightsafe masking film which can be suitably used for both common use and resticking.

DESCRIPTION OF THE PREFERRED EMBODIMENTS

In accordance with the present invention there is provided a lightsafe masking film having a substrate, a pressure sensitive adhesive layer formed on the substrate, and a lightsafe, peelable layer formed on the adhesive layer and including a dialkyl phthalate, nitrocellulose, and a lightsafe colorant.

The present invention will now be described in detail below.

Lightsafe masking film according to the present invention is composed of a transparent substrate formed of a plastic material having provided thereon a pressure sensitive adhesive layer and a peelable, transparent, lightsafe layer in that order.

Any plastic material conventionally used as a transparent substrate in known lightsafe masking films can be used for the purpose of the present invention. Synthetic resin films, semisynthetic resin films and laminated films thereof may be used as the substrate. Illustrative of suitable synthetic resin films are those formed of a polyester such as polyethylene terephthalate or polybutylene terephthalate, an aromatic polyamide, an aliphatic polyamide, a polyolefin such as polyethylene or polypropylene, a polystyrene, a polycarbonate, a polyvinyl chloride and a polyvinylidene chloride. Illustrative of a suitable semisynthetic resin film is that formed of a cellulose acetate. Examples of the laminated films include those using a combination of synthetic resin layers, a combination of synthetic resin and semisynthetic resin layers, a combination of a cellulose layer and a synthetic resin layer and/or a semisynthetic resin layer. Above all, a polyethylene terephalate film is an especially preferred substrate for reasons of excellent dimensional stability and excellent tensile strength and tearing strength. The thickness of the film is generally in the range of 20–300 $\mu$m, preferably 50–250 $\mu$m. Both stretched and non-stretched films may be used as the substrate.

The pressure sensitive adhesive layer provided over the surface of the substrate may be formed of a synthetic resin adhesive such as an acrylate ester copolymer, a saturated polyester or a polyurethane, or a rubber adhesive such as a natural rubber, a chloroprene rubber, isoprene rubber or a nitrile rubber.

The peelable, lightsafe layer provided on the pressure sensitive layer is comprised of the following components:

(a) a dialkyl phthalate,
(b) nitrocellulose,
(c) a lightsafe colorant,
(d) a nitrile rubber,
(e) a filler, and
(f) a dialkyl ester of an aliphatic dicarboxylic acid, with components (d) through (f) being optional ingredients.

It has been found that when the dialkyl phthalate (a) is used in conjunction with nitrocellulose, the resulting layer is prevented from being broken or lengthened when it is peeled off from the substrate. Further, the peeled layer is suited for resticking but has good anti-blocking property. The latter property advantageously permits storage of the masking films in a stacked or superimposed state without causing sticking of the films with each other.

Preferably, the two alkyl groups of the phthalate (a) have, independently from each other, 4–10 carbon atoms. Illustrative of suitable dialkyl phthalates are bis(2-ethylhexyl) phthalate, di-n-octyl phthalate, diisodecyl phthalate and diisononyl phthalate.

The nitrocellulose (b) preferably has a nitrogen content of 10.7–12.2% by weight.

The lightsafe colorant (c) can be any lightsafe dye or pigment which is commonly used for lightsafe masking film. Its color tone is not specifically limited. One or a plurality of colorants are suitably selected so as impart the desired light-blocking or light-screening property to the lightsafe layer.

The nitrile rubber (d) is, for example, a copolymer of acrylonitrile and other copolymerizable monomer, such as a copolymer of acrylonitrile and butadiene or a terpolymer of acrylonitrile, butadiene and a carboxyl group-containing monomer, and preferably has an acrylonitrile content of 19–51% by weight. The nitrile rubber imparts suitable adhesiveness and suitable peelability to the lightsafe layer.

The filler (d) is preferably incorporated into the lightsafe layer for the purpose of improving peelability of the lightsafe layer from the substrate while maintaining desired bonding therebetween, suppressing reflection of light on the surface of the lightsafe layer, and for reducing the surface tackiness of the lightsafe layer. The filler generally has an average particle size of 0.1-20 μm, preferably 1-15 μm. Both organic fillers, such as benzoguanamine resins, crosslinked polystyrenes and polyethylenes, and inorganic fillers, such as silica, synthetic silica, talc and magnesium oxide, may be used.

The masking film according to the present invention may be suitably used for fully automatic, step and repeat machines. In such a case, it is preferred that the filler be incorporated into the lightsafe layer so that the lightsafe layer has a surface roughness of 0.3-1 μm in terms of the centerline surface height. The use of a filler having an average particle size of 0.2-12 μm gives desired results.

It is preferred that the dialkyl phthalate (a) be used in combination with a dialkyl ester of an aliphatic dicarboxylic acid since the resulting lightsafe layer can exhibit improved flexibility and peelability and since the physical properties thereof are substantially independent of temperature variation, as will be appreciated from the working examples described hereinafter. Examples of the aliphatic dicarboxylic acids include adipic acid, azelaic acid and cebacic acid. Preferably, the two alkyl groups of the dicarboxylic acid ester (f) have, independently from each other, 4-10 carbon atoms. Illustrative of suitable dicarboxylic acid esters are di-n-octyl adipate, di(2-ethylhexyl) adipate, dioctyl cebacate, dioctyl azelate, dibutyl adipate and dibutyl cebacate.

The above-mentioned components (a)-(f) are preferably used in the following proportions (as solids):

Amount of the dialkyl phthalate (a):
  10-50%, more preferably 20-40%, based on the total weight of (a)+(b)+(d)+(f);
Amount of the nitrocellulose (b):
  50-60%, more preferably 51-59%, based on the total weight of (a)+(b)+(d)+(f);
Amount of the nitrile rubber (d):
  0-30%, more preferably 1-20%, based on the total weight of (a)+(b)+(d)+(f);
Amount of a total of the aliphatic dicarboxylic acid ester (f) and the dialkyl phthalate (a):
  10-50%, more preferably 20-40%, based on the total weight of (a)+(b)+(d)+(f);
Amount of the aliphatic dicarboxylic acid ester (f):
  0-75%, more preferably 5-75%, most preferably 10-50% based on the total weight of (a)+(f);
Amount of the colorant (c):
  3-30%, more preferably 5-20%, based on the total weight of (a)+(b)+(d)+(f);
Amount of the filler (e):
  0.1-20%, more preferably 0.5-15%, based on the total weight of (a)+(b)+(d)+(f).

The amount of component (a) or components (a)+(f) has an influence upon the surface tackiness of the lightsafe layer and upon resistance to breakage. Too large an amount will cause reduction of anti-blocking property of the layer whereas too small an amount will cause reduction of resistance to breakage. Too large an amount of component (d) will cause the lengthening of the layer during peeling operation and the lowering of dimensional stability. When the ratio of component (f) to component (a) is excessively high, the anti-blocking property and dimensional stability of the lightsafe layer become lowered.

The lightsafe layer may be prepared by any known manner such as by applying a coating composition containing the above ingredients on the surface of the adhesive layer which has been provided on the substrate. A solvent such as an alcohol, an ester, a hydrocarbon, a halogenated hydrocarbon, a ketone or the like organic solvent can be used for the formation of the coating composition. The lightsafe layer generally has a thickness of 10-50 μm, preferably 15-45 μm. For step and repeat machines, the lightsafe layer preferably has a thickness of 20-40 μm.

The masking film according to the present invention can be advantageously used in both cases where the lightsafe layer is peeled off as usual way and where the peeled layer is used by resticking. A number of modifications may be made to the masking film of the present invention. For example, it is possible to provide a section pattern on the surface of the lightsafe layer by photographic printing or by laminating a section film for the purpose of facilitating work for the formation of cutting lines precisely at desired positions of the lightsafe layer.

The following examples will further illustrate the present invention.

EXAMPLE 1

A commercially available pressure sensitive adhesive was applied to a 125 μm thick polyethylene terephthalate film and the coat was dried at 80° C. for 1 minute to obtain an adhesive layer. Onto this layer was applied a coating solution having the formulation shown in Table 1. The coat was dried for 2 minutes at 80° C. and for another 2 minutes at 130° C. to form a peelable, lightsafe layer having a thickness of 40 μm on the adhesive layer. The thus obtained masking film was then tested for dimensional stability, resistance to breakage and anti-blocking property of the lightsafe layer. The test results are shown in Table 1. The test methods are as follows:

(1) Dimensional stability test:
The lightsafe layer is cut with a knife to form a predetermined pattern and the pattern is peeled off. Dimensional stability is evaluated from the degree of lengthening of the peeled pattern according to the following ratings:
  5: Not at all lengthened
  4: Slightly lengthened
  3: Moderately lengthened
  2: Fairly lengthened
  1: Considerably lengthened (2) Resistance to breakage test:
The lightsafe layer is cut with a knife to form a predetermined pattern and the pattern is peeled off. Tendency of the pattern to be broken during the peeling is checked and rated as follows:
  5: Not at all broken
  4: Very slightly broken
  3: Slightly broken
  2: Fairly broken
  1: Considerably broken (3) Anti-blocking property test:
Two masking films are superimposed with the substrate of the upper film contacting with the lightsafe layer of the lower film. The two films are then allowed to stand at 50° C. 80% humidity for 5 hours while applying a load of 30 g/cm² thereto. Tendency of the films to stick to each other at their contact is examined and is rated as follows:

5: No stick at all
4: Slightly partly stick
3: Partly stick
2: Greater part stick
1: Entirely stick It is desirous that the physical properties of lightsafe layers remain unchanged with the change in temperature. Thus, the boding strength and tendency to be lengthened during peeling of the sample are measured after standing the sample at various temperatures at a relative humidity of 60 % for 24 hours to evaluate the temperature dependence thereof.

5: Substantially no change

TABLE 1

|  | Sample No. | | | | | | | | | |
| --- | --- | --- | --- | --- | --- | --- | --- | --- | --- | --- |
|  | 1 | 2 | 3 | 4 | 5 | 6 | 7 | 8*5 | 9*5 | 10*5 |
| Composition (wt %) | | | | | | | | | | |
| Bis(2-ethylhexyl)phthalate | 65 | 42 | 37 | 29 | 21 | 13 | 5 | 0 | 0 | 0 |
| Nitrocellulose (H-5) | 35 | 58 | 58 | 58 | 58 | 58 | 58 | 53 | 58 | 58 |
| Nitrile rubber*1 | 0 | 0 | 5 | 13 | 21 | 29 | 37 | 40 | 29 | 29 |
| Colorant*2 | 3 | 3 | 3 | 3 | 3 | 3 | 3 | 3 | 3 | 3 |
| Filler*3 | 2 | 2 | 2 | 2 | 2 | 2 | 2 | 2 | 2 | 2 |
| Epoxydized fatty acid ester*4 | 0 | 0 | 0 | 0 | 0 | 0 | 0 | 7 | 0 | 0 |
| Trioctyl trimeritate | 0 | 0 | 0 | 0 | 0 | 0 | 0 | 0 | 13 | 0 |
| Di(butoxyethoxyethyl) adipate | 0 | 0 | 0 | 0 | 0 | 0 | 0 | 0 | 0 | 13 |
| Methyl ethyl ketone | 74 | 74 | 102 | 147 | 192 | 237 | 282 | 328 | 237 | 237 |
| Physical property | | | | | | | | | | |
| Dimensional stability | 4 | 4 | 4 | 4 | 4 | 4 | 3 | 3 | 4 | 4 |
| Resistance to breakage | 4 | 4 | 4 | 4 | 4 | 4 | 3 | 3 | 4 | 3 |
| Anti-blocking property | 1 | 5 | 5 | 5 | 5 | 4 | 3 | 3 | 3 | 3 |

*1Nipol 1042 manufactured by Nihon Zeon Inc., acrylonitrile content: 33 wt. %
*2Aizen Spilon Orange GRH (C.I. Solvent Orange 37) and Aizen Spilon Red GHE (C.I. Solvent Red 84) both manufactured by Hodogaya Chemical Inc.
*3Silica, SILOID 74 manufactured by Fuji-Division Inc.
*4Sansosizer E-4030 manufactured by Shin Nihon Rika Inc.
*5Comparative sample

EXAMPLE 2

A commercially available pressure sensitive adhesive was applied to a 125 μm thick polyethylene terephthalate film and the coat was dried at 80° C. for 1 minute to obtain an adhesive layer. Onto this layer was applied a coating solution having the formulation shown in Table 2. The weight ratio of bis(2-ethylhexyl)phthalate to dioctyl adipate is 80:20. The coat was dried for 2 minutes at 80° C. and for another 2 minutes at 130° C. to form a peelable, lightsafe layer having a thickness of 40 μm on the adhesive layer. The masking film was then tested for dimensional stability, resistance to breakage, antiblocking property, flexibility and temperature dependence. The test results are shown in Table 2. The temperature dependence test and the flexibility tests were performed as follows:

(5) Temperature dependence test:

4: Slightly changed
3: Moderately changed
2: Fairly changed
1: Considerably changed (6) Flexibility test:
The lightsafe layer is peeled off and easiness to be peeled off is evaluated. The peelability represents flexibility of the sample.

5: Excellent
4: Very good
3: Good
2: Bad
1: Poor

TABLE 2

|  | Sample No. | | | | | | |
| --- | --- | --- | --- | --- | --- | --- | --- |
|  | 11 | 12 | 13 | 14 | 15 | 16*6 | 17*6 |
| Composition (wt %) | | | | | | | |
| Bis(2-ethylhexyl)hthalate | 33.6 | 29.6 | 25.6 | 17.6 | 9.6 | 0 | 0 |
| Di-n-octyl adipate | 8.4 | 7.4 | 6.4 | 4.4 | 2.4 | 0 | 0 |
| Nitrocellulose (H-5) | 58 | 58 | 58 | 58 | 58 | 53 | 58 |
| Nitrile rubber*1 | 0 | 5 | 10 | 20 | 30 | 40 | 30 |
| Colorant*2 | 3 | 3 | 3 | 3 | 3 | 3 | 3 |
| Filler*3 | 2 | 2 | 2 | 2 | 2 | 2 | 2 |
| Epoxydized fatty acid ester*4 | 0 | 0 | 0 | 0 | 0 | 7 | 0 |
| Trioctyl trimeritate | 0 | 0 | 0 | 0 | 0 | 0 | 9.6 |
| Di(butoxyethoxyethyl) adipate | 0 | 0 | 0 | 0 | 0 | 0 | 2.4 |
| Methyl ethyl ketone | 74 | 102 | 147 | 192 | 237 | 328 | 237 |
| Physical property | | | | | | | |
| Dimensional stability | 4 | 5 | 5 | 4 | 4 | 3 | 4 |
| Flexibility | 5 | 5 | 5 | 4 | 4 | 3 | 3 |
| Anti-blocking property | 4 | 5 | 5 | 5 | 4 | 3 | 4 |
| Temperature dependence | 5 | 5 | 5 | 4 | 4 | 3 | 3 |

*1-4The same as in Table 1
*6Comparative sample

EXAMPLE 3

Example 2 for sample No. 12 was repeated in the same manner as described except that the ratio of the phthalate to the adipate was changed as shown in Table 3. The results are shown in Table 3.

EXAMPLE 4

Example 2 for sample No. 12 was repeated in the same manner as described except that di-n-octyl cebacate was used in place of di-n-octyl adipate. Similar results were obtained.

TABLE 3

| | Sample No. | | | | | |
|---|---|---|---|---|---|---|
| | 18 | 19 | 20 | 21 | 22 | 23*7 |
| Weight ratio of Bis(2-ethylhexyl) phthalate to di-n-octyl adipate | 100/0 | 90/10 | 80/20 | 54/46 | 27/73 | 0/100 |
| Dimensional stability | 5 | 5 | 5 | 4 | 3 | 3 |
| Flexibility | 4 | 4 | 5 | 5 | 5 | 5 |
| Anti-blocking property | 5 | 5 | 5 | 4 | 4 | 3 |
| Temperature dependence | 3 | 4 | 5 | 5 | 5 | 5 |

*7 Comparative sample

EXAMPLE 5

A commercially available pressure sensitive adhesive was applied to a 125 $\mu$m thick polyethylene terephthalate film and the coat was dried at 80° C. for 1 minute to obtain an adhesive layer. Onto this layer was applied a coating solution having the formulation shown below:

| Bis(2-ethylhexyl)phthalate | 25.6 |
|---|---|
| Di-n-octyl adipate | 6.4 |
| Nitrocellulose (H-5) | 58 |
| Nitrile rubber*1 | 10 |
| Colorant*2 | 3 |
| Filler*8 | 2 |
| Methyl ethyl ketone | 147 |

*1,2 The same as in Table 1
*8 Silica, SILOID 404 manufactured by Fuji-Divison Inc.

The coat was dried for 2 minutes at 80° C. and for another 2 minutes at 130° C. to form a peelable, lightsafe layer having a thickness of 30 $\mu$m on the adhesive layer. The lightsafe layer had a centerline surface height of 0.6 $\mu$m when measured with a surface roughness meter (Surfcoder SE-30D manufactured by Kosaka Kenkyusho Inc.). The thus obtained masking film was then tested for dimensional stability, resistance to breakage, anti-blocking property, flexibility and temperature dependence of the lightsafe layer. Very good results were obtained. The masking film was found to be suited for use in a commercially available, fully automated graphic arts equipment (Step and Repeat Machine manufactured by Dainippon Screen Mfg. Co., Ltd.).

What is claimed is:

1. A lightsafe masking film, comprising a substrate, a pressure sensitive adhesive layer formed on said substrate, and a lightsafe, peelable layer formed on said adhesive layer and including a dialkyl phthalate, nitrocellulose, and a lightsafe colorant, said dialkyl phthalate being 10–50% of the total weight of said dialkyl phthalate and said nitrocellulose.

2. A lightsafe masking film as set forth in claim 1, wherein the two alkyl groups of said phthalate have, independently from each other, 4–10 carbon atoms.

3. A lightsafe masking film as set forth in claim 1, wherein said dialkyl phthalate is bis(2 ethylhexyl) phthalate, di-n-octyl phthalate, diisodecyl phthalate and diisononyl phthalate.

4. A lightsafe masking film as set forth in claim 1, wherein said lightsafe layer further includes a nitrile rubber in an amount of up to 30% based on the total weight of said dialkyl phthalate, nitrocellulose and nitrile rubber.

5. A lightsafe masking film as set forth in claim 4, wherein said lightsafe layer further includes a filler in an amount of 0.1–20% based on the total weight of said dialkyl phthalate, nitrocellulose and nitrile rubber.

6. A lightsafe masking film as set forth in claim 5, wherein said filler has an average particle size of 0.1–15 $\mu$m and is contained in said lightsafe layer in an amount so that the lightsafe layer has a surface roughness of 0.05–1.5 $\mu$m in terms of the centerline surface height.

7. A lightsafe masking film as set forth in claim 6, wherein said filler has an average particle size of 0.2–12 $\mu$m and is contained in said lightsafe layer in an amount so that the lightsafe layer has a surface roughness of 0.3–1 $\mu$m in terms of the centerline surface height.

8. A lightsafe masking film, comprising a substrate, a pressure sensitive adhesive layer formed on said substrate, and a lightsafe, peelable layer formed on said adhesive layer and including a dialkyl phthalate, nitrocellulose, a dialkyl ester of an aliphatic dicarboxylic acid and a lightsafe colorant, wherein the total amount of said dialkyl ester and said dialkyl phthalate is 10–50% of the total weight of said dialkyl ester, dialkyl phthalate and nitrocellulose and wherein the amount of said dialkyl ester is 5–75% of the total weight of said dialkyl ester and dialkyl phthalate.

9. A lightsafe masking film as set forth in claim 8, wherein the two alkyl groups of said dialkyl ester have, independently from each other, 4–10 carbon atoms.

10. A lightsafe masking film as set forth in claim 10, wherein said dicarboxylic acid is selected from the group consisting of adipic acid, azelaic acid and cebacic acid.

11. A lightsafe masking film as set forth in claim 8, wherein said dialkyl ester is di-n-octyl adipate, di(2-ethylhexyl) adipate, dioctyl cebacate, dioctyl azelate, dibutyl adipate and dibutyl cebacate.

12. A lightsafe masking film as set forth in claim 8, wherein said lightsafe layer further includes a nitrile rubber in an amount of up to 30% based on the total weight of said dialkyl ester, dialkyl phthalate, nitrocellulose and nitrile rubber.

13. A lightsafe masking film as set forth in claim 12, wherein said lightsafe layer further includes a filler in an amount of 0.1–20% based on the total weight of said dialkyl ester, dialkyl phthalate, nitrocellulose and nitrile rubber.

14. A lightsafe masking film as set forth in claim 13, wherein said filler has an average particle size of 0.1–15 $\mu$m and is contained in said lightsafe layer in an amount so that the lightsafe layer has a surface roughness of 0.05–1.5 $\mu$m in terms of the centerline surface height.

15. A lightsafe masking film as set forth in claim 14, wherein said filler has an average particle size of 0.2–12 $\mu$m and is contained in said lightsafe layer in an amount so that the lightsafe layer has a surface roughness of 0.3-1 μm in terms of the centerline surface height.

16. A lightsafe masking film as set forth in claim 1, wherein said lightsafe layer has a section pattern on the surface thereof.

17. A lightsafe masking film as set forth in claim 16, wherein said section pattern is printed direct on the surface of the lightsafe layer.

18. A lightsafe masking film as set forth in claim 17, wherein said section pattern is printed on a transparent film which in turn is laminated on the surface of the lightsafe layer.

* * * * *

UNITED STATES PATENT AND TRADEMARK OFFICE
CERTIFICATE OF CORRECTION

PATENT NO.  : 5,009,944

DATED       : April 23, 1991

INVENTOR(S) : MARUYAMA et al

It is certified that error appears in the above-identified patent and that said Letters Patent is hereby corrected as shown below:

Col. 8, line 43, delete "10" and insert --9--;

line 66, delete "14" and insert --13--.

Col. 10, line 3, "17" should read --16--.

Signed and Sealed this

First Day of September, 1992

Attest:

DOUGLAS B. COMER

*Attesting Officer*    *Acting Commissioner of Patents and Trademarks*